United States Patent
Goodman

(10) Patent No.: US 11,812,662 B2
(45) Date of Patent: Nov. 7, 2023

(54) EVAPORATIVE ELECTRICAL POWER GENERATING APPARATUS

(71) Applicant: Jonathan Bruce Goodman, Fort Collins, CO (US)

(72) Inventor: Jonathan Bruce Goodman, Fort Collins, CO (US)

(*) Notice: Subject to any disclaimer, the term of this patent is extended or adjusted under 35 U.S.C. 154(b) by 0 days.

(21) Appl. No.: 17/538,728

(22) Filed: Nov. 30, 2021

(65) Prior Publication Data
US 2022/0173300 A1 Jun. 2, 2022

Related U.S. Application Data

(60) Provisional application No. 63/119,934, filed on Dec. 1, 2020.

(51) Int. Cl.
*H10N 10/13* (2023.01)

(52) U.S. Cl.
CPC .................. *H10N 10/13* (2023.02)

(58) Field of Classification Search
None
See application file for complete search history.

(56) References Cited

U.S. PATENT DOCUMENTS

| | | | |
|---|---|---|---|
| 2,177,630 A | 10/1939 | Alder | |
| 4,802,929 A | 7/1989 | Schock | |
| 8,692,653 B2 * | 4/2014 | Shionoiri | H01Q 9/285 340/10.3 |
| 2009/0158750 A1 | 6/2009 | Rubin | |
| 2010/0107657 A1 | 5/2010 | Vistakula | |
| 2019/0381460 A1 | 12/2019 | Peng et al. | |
| 2020/0388739 A1 * | 12/2020 | Chintala | H02J 7/32 |

FOREIGN PATENT DOCUMENTS

WO    WO2019116039 A1    6/2019

OTHER PUBLICATIONS

International Search Report and Written Opinion of the International Searching Authority in PCT International Patent Application No. PCT/US21/61261 Published Jun. 9, 2022 as WO2022/119851, Title: "Evaporative Electrical Power Generating Apparatus".

* cited by examiner

Primary Examiner — Tamir Ayad
(74) Attorney, Agent, or Firm — Samuel M. Freund; Cochran Freund & Young LLC

(57) ABSTRACT

An apparatus and method for producing a temperature difference between the sides of a Thermo-Electric Generator (TEG) for generating electrical power are described. Water is used to saturate a wicking material in thermal communication with at least one thermal conductor, such as metal tubing or wires, whereby one side of the TEG is cooled by the reduction of heat caused by the evaporation of the liquid from the material, and transferred to the TEG by the at least one thermal conductor. The other side of the TEG is maintained in a dry condition, and exposed to ambient conditions, thereby remaining at ambient temperature and, as a result, containing more heat than the cooled side.

11 Claims, 4 Drawing Sheets

EVAPORATIVE ELECTRICAL POWER GENERATING APPARATUS

CROSS-REFERENCE TO RELATED APPLICATIONS

The present application claims the benefit of U.S. Provisional Patent Application No. 63/119,934 for "Novel Solid State Evaporative Electrical Power Generating Device" by Jonathan Bruce Goodman, which was filed on Dec. 1, 2020, the entire content of which application is hereby specifically incorporated by reference herein for all that it discloses and teaches.

BACKGROUND

Energy harvesting circuitry has been rapidly improving since the demand for "Internet of Things" (system of interrelated, internet-connected objects for collecting and transferring data over a wireless network) sensors have created the need for low power, remote, wireless power sources. Many types of sources exist such as solar power, vibrational power, RF power, thermal power etc.; however, no one technique for generating power is suitable for all the possible applications. For example, solar power can be used only when there is light available.

SUMMARY

In accordance with the purposes of the present invention, as embodied and broadly described herein, an embodiment of the electrical power generator, hereof, includes: a thermoelectric generator having a cooled side, an uncooled (warm side), and an electrical output; a first thermally conducting metal plate having a first face and a second face, the first face being in thermal contact with the cooled side of the thermoelectric generator; at least one thermally conducting tube or wire having a first end and a second end, the first end being in thermal contact with the second face of the first metal plate; a liquid; a cotton hygrometer wicking material surrounding a portion of the at least one thermally conducting tube or wire, a portion of the wicking material being submerged in the liquid for drawing the liquid into the wicking material by capillary action, whereby the at least one thermally conducting tube or wire is cooled by evaporation of the liquid from the wicking material, and the first metal plate and the cooled junction of the thermoelectric generator are cooled by the thermally conducting tube or wire, such that a voltage is generated at the electrical output of the thermoelectric generator; an energy harvesting apparatus for increasing the voltage generated by the thermoelectric generator; and a container for holding the liquid, and for supporting the electrical power generator.

In another embodiment of the present invention and in accordance with the purposes thereof, the electrical power generator, hereof, includes: a thermoelectric generator having a cooled side and an uncooled (warm) side, and an electrical output; a first thermally conducting metal plate having a first face and a second face, the first face being in thermal contact with the cooled face of the thermoelectric generator; at least one thermally conducting tube or wire having a first end and a second end, the first end being in thermal contact with the second face of the first metal plate; a liquid; and a wicking material surrounding a portion of the at least one thermally conducting tube or wire, a portion of the wicking material being submerged in the liquid, for drawing the liquid into the wicking material by capillary action, whereby the at least one thermally conducting tube or wire is cooled by evaporation of said liquid from the wicking material, and the first metal plate and the cooled side of said thermoelectric generator are cooled by the thermally conducting tube or wire, such that a voltage is generated at the electrical output of the thermoelectric generator.

In still another embodiment of the present invention and in accordance with the purposes thereof, the method for generating electrical power, hereof includes: providing a thermoelectric generator having a cooled side and an uncooled (warm) side, and an electrical output; placing at least one copper tube or wire in thermal contact with the cooled face of the thermoelectric generator; surrounding at least a portion of the at least one copper tube or wire with a wicking material; and contacting a portion of the wicking material with a liquid, such that the liquid is drawn into the wicking material by capillary action, and the at least one thermally conducting tube or wire is cooled by evaporation of the liquid from the wicking material, whereby the cooled side of the thermoelectric generator is cooled and a voltage is generated at the electrical output of the thermoelectric generator.

Benefits and advantages of the present invention include, but are not limited to, an apparatus for generating electric power from the evaporation of a liquid.

BRIEF DESCRIPTION OF THE DRAWINGS

The accompanying drawings, which are incorporated in and form a part of the specification, illustrate the embodiments of the present invention and, together with the description, serve to explain the principles of the invention. In the drawings.

DETAILED DESCRIPTION OF THE INVENTION

Briefly, embodiments of the present invention include producing a temperature difference between the sides of a Thermo-Electric Generator (TEG) for generating electrical power utilizing the Seebeck effect, or other thermoelectric generation. The TEG employed was a commercial device (Laird Corporation). Water (or other nontoxic liquid, which evaporates at room temperature, is readily wicked by the wicking material described below, and does not corrode copper, such as alcohols and ethylene glycol) was used to saturate cotton hygrometer wicks (or other wicking fabric, material, or device) in thermal communication with at least one thermal conductor, such as metal tubing or wires, whereby one side of the TEG is cooled by the reduction of heat caused by the evaporation of the liquid from the material. The second side of the TEG was maintained in a dry condition, and exposed to ambient conditions, thereby remaining at ambient temperature and, as a result, containing more heat than the cooled side. The thermal mass of each side may be increased by using aluminum (or copper) blocks, which also serve to secure the TEG. As stated, a plurality of tubing or wires on the cooled side is used to increase the surface area for liquid evaporation, while a plurality of tubing or wires can also be used to increase the surface area of the other side and to provide mounting structure for LEDs or other output devices. The present apparatus can be used for indoor, decorative, or functional applications, or be ruggedized for outdoor applications, if required.

Embodiments of the present invention can be used as a stand-alone apparatus if the application does not need the additional power of solar or other energy harvesting techniques. Moreover, individual electrical power generating apparatus can be combined in series or parallel, or combinations thereof, to increase voltage and current output for applications where greater power is required, such as charging cell phones or providing a 12 V source for an appliance, as examples.

Figure 1:
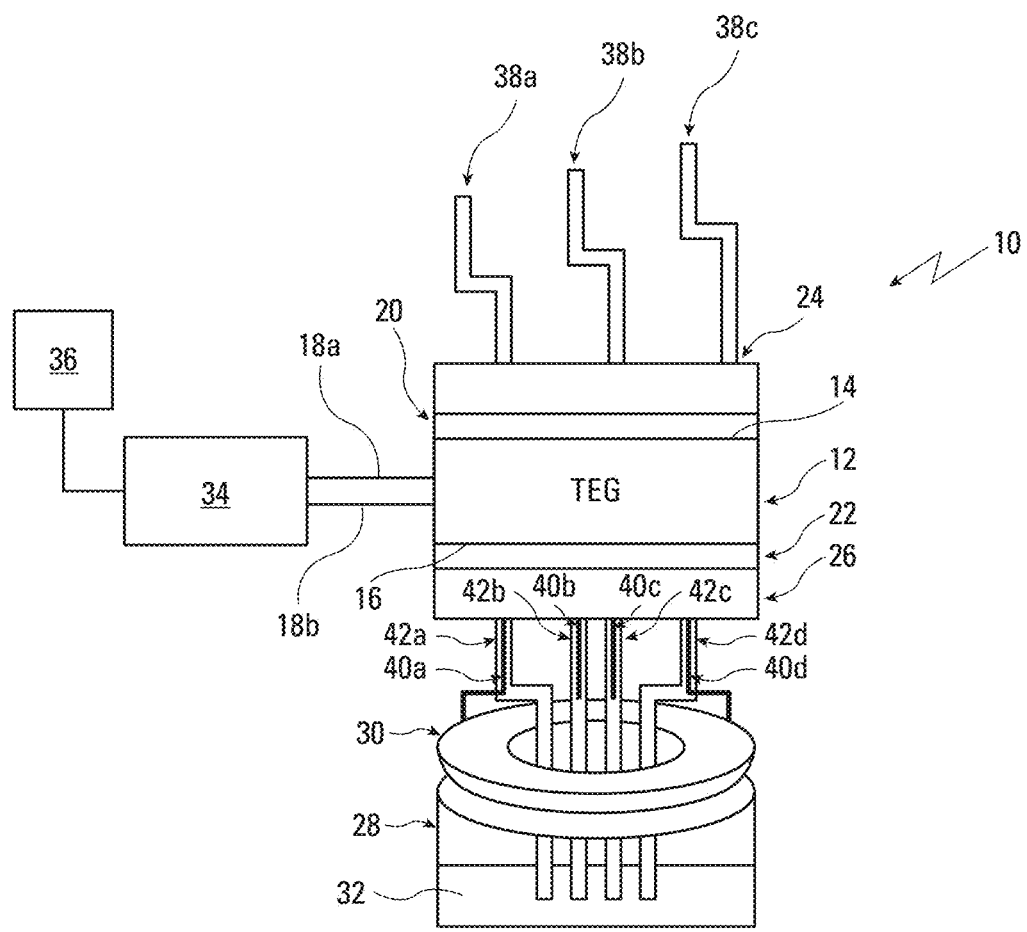
FIG. 1 is a schematic representation of an embodiment of the electrical power generating apparatus of the present invention illustrating a thermoelectric generator, being cooled on one side by liquid evaporation, the other side remaining at ambient temperature.

Reference will now be made in detail to the present embodiments of the invention, examples of which are illustrated in the accompanying drawings. In the Figures, similar structure will be identified using identical reference characters. It will be understood that the FIGURES are presented for the purpose of describing particular embodiments of the invention and are not intended to limit the invention thereto. Turning now to FIG. 1, a schematic representation of an embodiment of electrical power generating apparatus, 10. Thermoelectric generator, TEG, 12, is a commercially available device from Laird Corporation (Laird 430027-501 or equivalent), having an uncooled (warm) side or face, 14, a cooled side or face, 16, and an electrical output, 18a, and 18b, from each side, respectively. Graphite spacers, 20, and 22, or other thermal conductors, such as thermal epoxies, were employed on each side, 14 and 16 of TEG 12 as an interface between TEG 12 and metal plates 24 and 26, which may be aluminum or copper, as examples. Metal plates 24 and 26 support TEG 12 and increase the thermal mass thereof, and were constructed of ⅛-inch copper squares of 1.5756×1.575 in. to accommodate TEG 12. Graphite spacers 20 and 22 effectively conduct heat to and from TEG 12, while ensuring voids are eliminated between the interfaces, thereby improving the performance of device 10. Elements 12, 20, 22, 24, and 26, may be held together by many methods, with the objective being maximizing thermal contact between face 14, graphite spacer 20, and metal plate 24, and between side 16, graphite spacer 22, and metal plate 26. If screws are employed, such fasteners are selected for poor thermal conductivity, plastic as an example, to prevent heat from flowing around TEG 12, which would reduce the temperature difference between the two junctions, and reduce the generated voltage. Container, 28, having cover 30, holds liquid, 32, which will generally be water, but may comprise another suitable liquid. Energy harvesting apparatus, 34, which will be discussed in more detail below, manages the voltage and current generated by TEG 12 through electrical output 18, and directs suitable electrical input to application load 36, which may include motors, actuators, LEDs, sensors, Internet of things transmitters, etc. A plurality of tubing or wires, 38a-38c, attached to metal plate 24, by soldering, as an example, can be used to increase the surface area of uncooled (warm) side 14 and to provide mounting structure for LEDs or other output devices.

Figure 2:
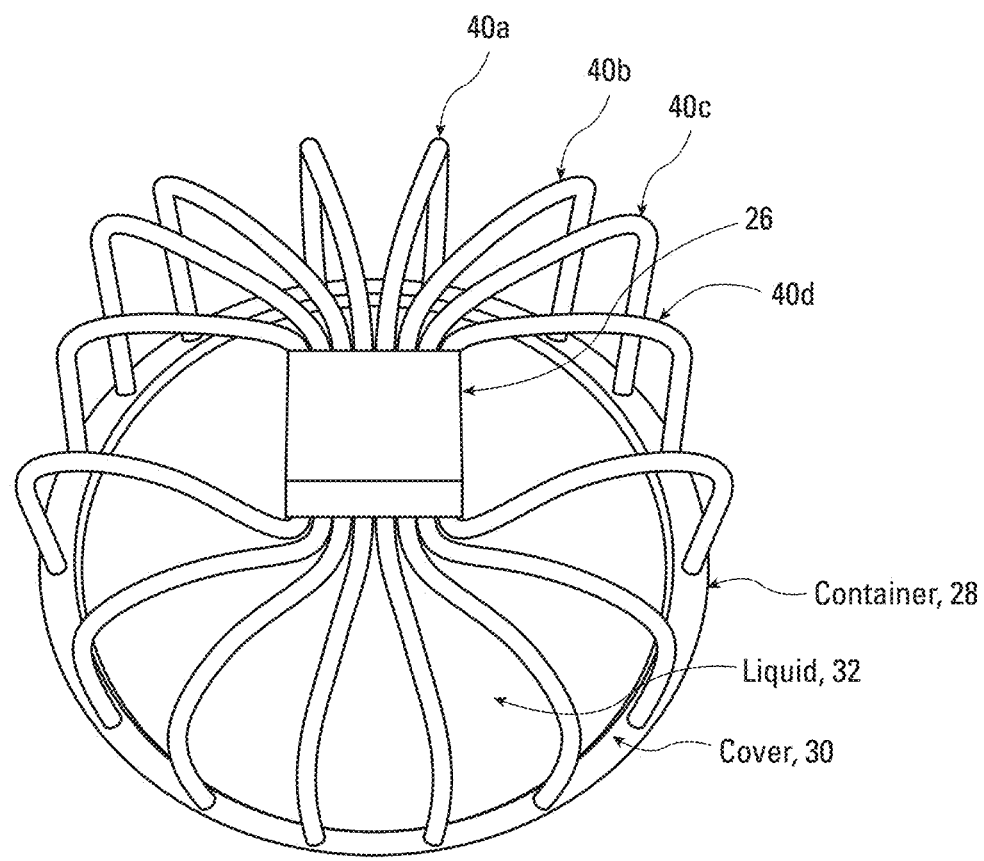
FIG. 2 is a schematic representation of the liquid evaporation apparatus for cooling the thermoelectric generator, including a source of liquid and wires or tubes covered by wicking material in contact with the liquid.

Wires or tubes 40a-40d are attached at one end to plate 26, and at the other to cover 30, as seen in FIG. 2, for supporting TEG 12 and elements attached thereto. The attachment to plate 26 may be made using solder, and a plurality of holes in the perimeter of cover 30 may be provided to secure at least some of the wires or tubes 40a-40d to the cover. Non-thermally conductive wicks, 42a-42d, cover thermally conducting wires or tubes, 40a-40d over a portion of their length, and are submerged in part in water 32 in container 28. Wicks 42a-42d conduct water out of container 28 by capillary action, and cool the portions of wires or tubes 40a-40d with which they are in thermal contact by evaporation into the surrounding ambient air, whereby metal plate 26 and graphite spacer 22 are cooled below ambient temperature. Heat is thereby conducted away from the cooled side of TEG 12. Cover 30 thus provides mechanical support, but also functions a barrier to prevent the water in container 28 from evaporating directly into the air without first going through wicks 42a-42d, which would raise the ambient humidity around plate 22 and reduce the performance of TEG 12. Cotton hygrometer wicks were chosen to maximize the surface area of evaporation around wires or tubes 40a-40d, which transport heat to the wick, whereby the temperature of the wires is lowered. Other wicking materials may be utilized, such as polyester and nylon. Distilled water was chosen as operating liquid 32 to minimize the accumulation of contaminates (such as minerals, bacteria, mold etc.) in wicks 42a-42d, which can be removed and washed or replaced, if necessary.

As seen in FIG. 2, the wires are bent to a desired shape, which supports plate 26 above cover 30 for allowing air to flow underneath the assembly. The wires are covered with wick material 42a-42d, having length longer than the length of the wires, such that the excess wick material is submerged in liquid 32 through an opening or openings in cover 30. The wicks may be cut sufficiently long that they reach the bottom of container 28. Wicks 42a-42d are evenly spaced for optimizing evaporation, since relative humidity around one wick can interfere with evaporation from another.

The temperature difference between uncooled side 14, and cooled side 16 causes TEG 12 to generate electric power which is then electrically conducted to energy harvesting apparatus, 34 for processing, storage, and delivery to application load 36. The amount of power generated is determined by the temperature difference, which is dependent on ambient relative humidity and temperature as well as the output efficiency of TEG 12. Power losses in power harvesting apparatus 34 also reduce the overall output.

Having generally described embodiments of the invention, the following EXAMPLE illustrates additional details thereof.

EXAMPLE

Electrical power generating apparatus, 10, has been used to power multiple blinking LEDs attached to tubes or wires 38a-38c, mounted on metal plate 24. The wires were formed into decorative assemblies. The cathode of each LED was placed in electrical communication with each wire attached to metal plate 24, as an electrical common. A lens was attached to each LED to diffuse the light and improve the viewing angle. The anode of each LED was placed in electrical communication with energy harvesting apparatus, 34 as load 36. Maintaining an LED continuously in an on condition requires between 10 mA and 20 mA at between 2 V and 4 V which is greater than apparatus 10 can instantaneously generate. By contrast, TEG 12 generates a current and voltage when a temperature difference is established between the uncooled and cooled sides thereof, typically, between 30 mV and 40 mV at between 10 mA and 20 mA, for a temperature difference between 15 F and 20 F developed by the present apparatus at 70 F and 35% RH. This output voltage is too small for powering the desired loads.

Figure 3:
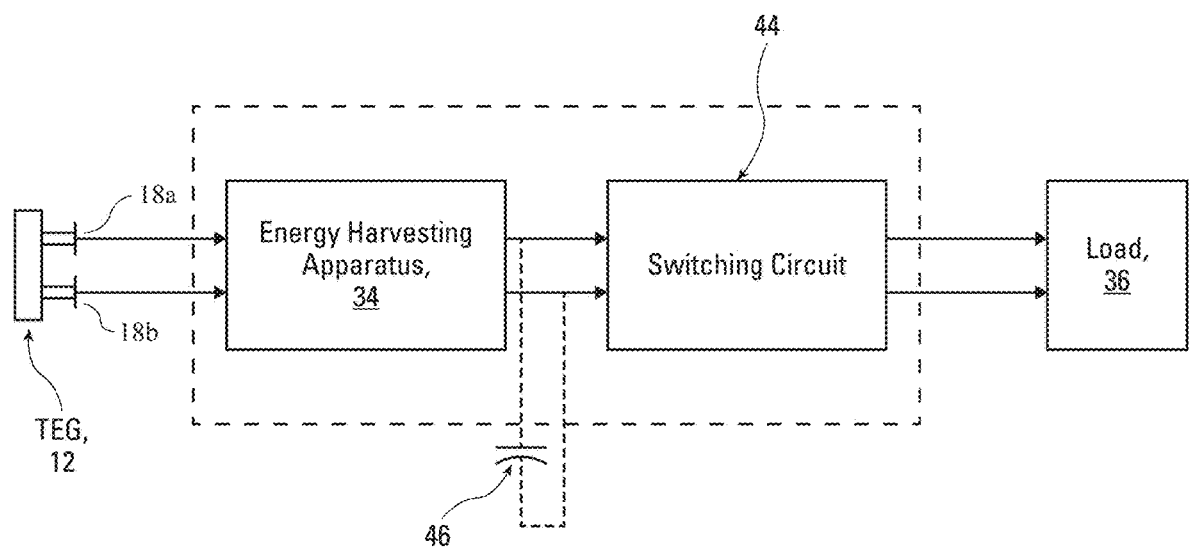
FIG. 3 is a schematic representation of a switching circuit in series with an energy harvesting apparatus for switching and sequencing loads which require higher voltages and currents than can be generated by the thermoelectric generator.

Therefore, switching and sequencing is necessary for lighting more than one LED, as illustrated in FIG. 3 and can be accomplished using discrete components, microprocessor/microcomputer circuits, and/or analog circuitry, the latter being used in the present apparatus, or a combination thereof. A network of TPS3839G33 (Texas Instruments) power monitor circuits, 44, one for each LED, was employed with energy harvesting apparatus 34 chosen, because of their low cost, flexibility of load types, and low power consumption, to power load 36. Each circuit has its own R/C filter to control the charge/discharge rate independently from the other circuits, thereby creating a random firing sequence depending on initial conditions and component tolerances and variations. Some outputs may be used with two LEDs to extend the number of lights in the output. By shorting the R in the circuit, the TPS3839G33 can directly turn on only when voltage is sufficient to power the load. Up to 8 mA can be sourced continuously from its output if available at the input. By using optional super capacitor, 46, at the output of the power harvesting apparatus 34, power can be stored over time and when sufficient, load 36 can be kept on until the input voltage drops below the threshold of the TPS3839G33. In this way, a wireless or Bluetooth transmitter can be powered for a short transmission of information.

Energy harvesting apparatus or circuit 34, which managed and regulated the power generated by TEG 12 is commercially available from several manufacturers such as Texas Instruments, Maxim Integrated Circuits, Analog Devices and Marlow. Analog Devices LTC3108-1, illustrated in Linear Technology LT 0813 Rev. B, Application Note PG 18, with pins VS1 and VS2 now configured for 4.5 V output instead of 3 V, and the micro-p sensors and XMTR not being included, was chosen for its simplicity, cost effectiveness and features. Moreover, it has low start-up voltage capability and low leakage, and relies on a MOSFET switch to form a resonant step-up oscillator using an external step-up transformer and a small coupling capacitor. This permits input voltages as low as 20 mV to be increased to 5.25 V for storage and powering loads. The frequency of oscillation is determined by the inductance of the secondary winding and is typically between 10 kHz and 100 kHz.

Optional 4F super capacitor 46 (the actual size needed was based on load 36) can temporarily store the required energy until load 36 returns to a lower steady state value, such as a starting current of 2 mA at 4.5V for 5 s, then falling to 50 µA, an example of which would be an LCD digital clock having automatic radio time-setting circuitry. It should be mentioned that the network of TPS3839G33 power monitor circuits, 44, but not supercapacitor 46, is required for the LED application.

As stated above, other methods for increasing the output voltage and current of electric power generating apparatus 10 include electrically connecting additional units in series, parallel, or a combination of series and parallel arrangements.

Figure 4A:
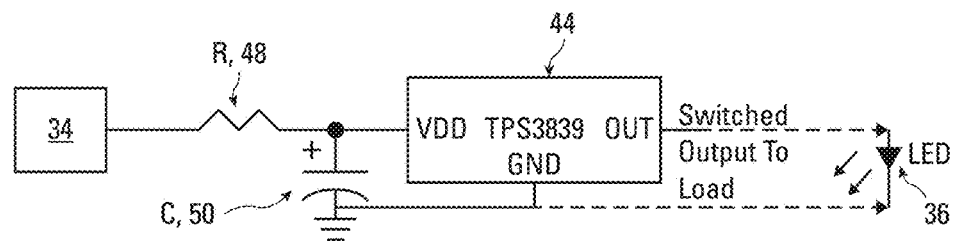
FIGS. 4A-4C, illustrate three loads, an LED (FIG. 4A), an LCD display (FIG. 4B), and an arbitrary load (FIG. 4C), respectively, driven by the output of the energy harvesting apparatus directed through a resistor, into a capacitor, and a switching circuit, which determines the charge/discharge period for the load, while the resistor limits the current drained from the energy harvester, whereby only partial current consumption for each load attached is permitted.
Figure 4B:
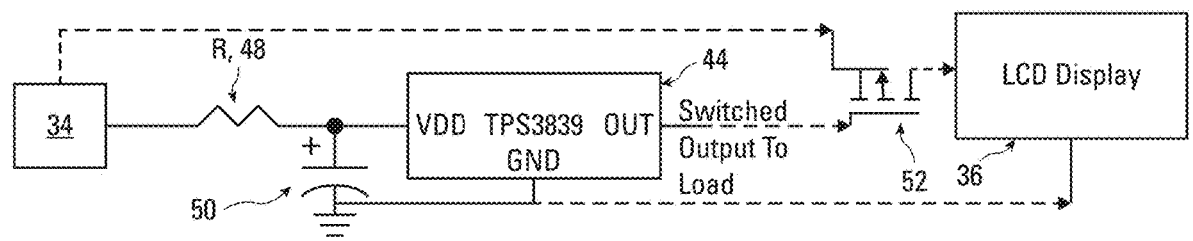
Figure 4C:
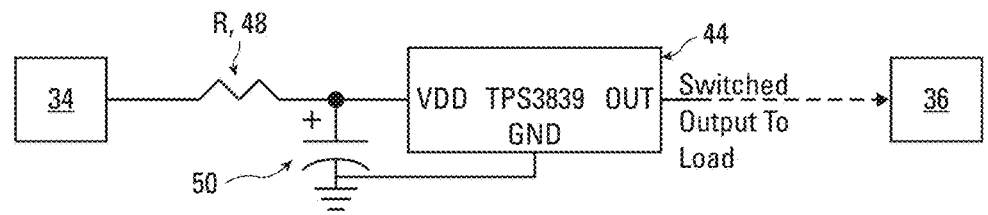

FIGS. 4A-4C, illustrate three loads 36, an LED (FIG. 4A), an LCD display (FIG. 4B), and an arbitrary load (FIG. 4C), respectively, driven by the output of energy harvesting apparatus 34 directed through resistor, 48, into capacitor, 50, and switching circuit 44, which determines the charge/discharge period for load 36, while resistor 48 limits the current drained from energy harvester 34, whereby only partial current consumption for each load attached is permitted. Multiple loads can be attached and operated independently as long as they collectively do not require more current than the energy harvester apparatus 34 can generate.

Switching circuit 44, which switches the output load when the internal voltage threshold is crossed at the input, and remains on until the input voltage drops below hysteresis voltage, after which it turns off, thereby allowing capacitor 50 to recharge. The on/off ratio is set by load 36 and the values chosen for the resistor 48 and the capacitor 50. It should be mentioned that LED load 36 in FIG. 4A can be driven directly by switching circuit 44.

FIG. 4B illustrates that use of optional FET switch, 52, allows the output of the energy harvester apparatus 34 to reach a stable voltage before a greater load is connected, as would be the situation for a digital wall clock or a temperature and humidity monitor.

The foregoing description of the invention has been presented for purposes of illustration and description and is not intended to be exhaustive or to limit the invention to the precise form disclosed, and many modifications and variations are possible in light of the above teaching. The embodiments were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. An electrical power generator, comprising:
   a thermoelectric generator having a cooled face and a warm face, and an electrical output;
   a first thermally conducting metal plate having a first face and a second face;
   a graphite spacer having a first face and a second face, the first face being in direct physical contact with the cooled face of said thermoelectric generator, and the second face being in direct physical contact with the first face of said first thermally conducting metal plate;
   at least one thermally conducting tube or wire having a first end and a second end, the first end being in thermal contact with the second face of said first metal plate;
   a liquid; and
   a wicking material surrounding a portion of said at least one thermally conducting tube or wire, a portion of said wicking material being submerged in said liquid, for drawing the liquid into said wicking material by capillary action, whereby said at least one thermally conducting tube or wire is cooled by evaporation of said liquid from said wicking material, and said first metal plate and the cooled face of said thermoelectric generator are cooled by said thermally conducting tube or wire, such that a voltage is generated at the electrical output of said thermoelectric generator.

2. The electrical power generator of claim 1, further comprising an energy harvesting apparatus having an electrical output, for increasing the voltage generated at the electrical output of said thermoelectric generator.

3. The electrical power generator of claim 2, further comprising a capacitor in parallel electrical connection with the electrical output of said energy harvesting apparatus, for storing power from said energy harvesting apparatus.

4. The electrical power generator of claim 1, wherein said liquid is chosen from water, alcohols, and ethylene glycol.

5. The electrical power generator of claim 1, wherein said wicking material is chosen from polyester, nylon, and cotton.

6. The electrical power generator of claim 1, further comprising a second thermally conducting metal plate having a first face and a second face, the first face being in thermal contact with the warm face of said thermoelectric generator, for increasing the thermal mass of said thermoelectric generator.

7. The electrical power generator of claim 1, further comprising a container for holding said liquid, and for supporting said electrical power generator.

8. An electrical power generator, comprising:
- a thermoelectric generator having a cooled face and a warm face, and an electrical output;
- a first thermally conducting metal plate having a first face and a second face;
- a graphite spacer having a first face and a second face, the first face being in direct physical contact with the cooled face of said thermoelectric generator, and the second face being in direct physical contact with the first face of said first thermally conducting metal plate;
- at least one thermally conducting tube or wire having a first end and a second end, the first end being in thermal contact with the second face of said first metal plate;
- a liquid;
- a cotton hygrometer wicking material surrounding a portion of said at least one thermally conducting tube or wire, a portion of said wicking material being submerged in said liquid, for drawing the liquid into said wicking material by capillary action, whereby said at least one thermally conducting tube or wire is cooled by evaporation of said liquid from said wicking material, and said first metal plate and the cooled face of said thermoelectric generator are cooled by said thermally conducting tube or wire, such that a voltage is generated at the electrical output of said thermoelectric generator;
- an energy harvesting apparatus having an electrical output, for increasing the voltage generated at the electrical output of said thermoelectric generator; and
- a container for holding said liquid, and for supporting said electrical power generator.

9. The electrical power generator of claim 8, further comprising a capacitor in parallel electrical connection with the electrical output of said energy harvesting apparatus, for storing power from said energy harvesting apparatus.

10. The electrical power generator of claim 8, wherein said liquid is chosen from water, alcohols, and ethylene glycol.

11. The electrical power generator of claim 8, further comprising a second thermally conducting metal plate having a first face and a second face, the first face being in thermal contact with the warm face of said thermoelectric generator, for increasing the thermal mass of said thermoelectric generator.

* * * * *